United States Patent
Suh et al.

(10) Patent No.: US 6,853,147 B2
(45) Date of Patent: Feb. 8, 2005

(54) ORGANIC EL DISPLAY DEVICE HAVING ORGANIC SOLUBLE DERIVATIVE LAYER

(75) Inventors: Min-Chul Suh, Sungnam (KR); Mu-Hyun Kim, Suwon (KR); Jang-Hyuk Kwon, Suwon (KR)

(73) Assignee: Samsung SDI Co., Ltd., Suwon-si (KR)

(*) Notice: Subject to any disclaimer, the term of this patent is extended or adjusted under 35 U.S.C. 154(b) by 2 days.

(21) Appl. No.: 10/167,651

(22) Filed: Jun. 13, 2002

(65) Prior Publication Data

US 2003/0098646 A1 May 29, 2003

(30) Foreign Application Priority Data

Nov. 28, 2001 (KR) .................................... 2001-74703

(51) Int. Cl.⁷ ..................... H05B 33/14; H05B 33/10
(52) U.S. Cl. ................ 315/169.3; 313/504; 445/24
(58) Field of Search .................. 315/169.3; 313/509, 313/502–506; 445/24; 428/690, 917, 428

(56) References Cited

U.S. PATENT DOCUMENTS

| | | | | |
|---|---|---|---|---|
| 5,103,269 A | * | 4/1992 | Tomomura et al. | 257/78 |
| 5,247,190 A | | 9/1993 | Friend et al. | 257/40 |
| 5,343,050 A | * | 8/1994 | Egusa et al. | 257/40 |
| 5,965,281 A | * | 10/1999 | Cao | 428/690 |
| 5,998,085 A | | 12/1999 | Isberg et al. | 430/20 |
| 6,001,413 A | * | 12/1999 | Matsuura et al. | 427/64 |
| 6,117,965 A | * | 9/2000 | Hwang et al. | 528/35 |
| 6,291,126 B2 | * | 9/2001 | Wolk et al. | 430/200 |
| 6,384,528 B1 | * | 5/2002 | Friend et al. | 313/504 |
| 6,391,482 B1 | * | 5/2002 | Matsuo et al. | 428/690 |
| 6,399,222 B2 | * | 6/2002 | Arai et al. | 428/690 |
| 6,402,579 B1 | * | 6/2002 | Pichler et al. | 445/24 |
| 6,404,126 B1 | * | 6/2002 | Arai et al. | 313/503 |
| 6,406,802 B1 | * | 6/2002 | Arai et al. | 428/690 |
| 6,488,555 B2 | * | 12/2002 | Pichler et al. | 445/24 |
| 6,586,876 B2 | * | 7/2003 | Tsai et al. | 313/509 |
| 6,597,109 B1 | * | 7/2003 | Arai et al. | 313/506 |
| 6,605,823 B1 | * | 8/2003 | Pichler et al. | 257/40 |
| 2002/0109458 A1 | * | 8/2002 | Pichler et al. | 313/504 |
| 2002/0190256 A1 | * | 12/2002 | Murakami et al. | 257/72 |

* cited by examiner

*Primary Examiner*—Don Wong
*Assistant Examiner*—Chuc Tran
(74) *Attorney, Agent, or Firm*—Stein, Mcewen & Bui, LLP

(57) ABSTRACT

An organic EL display device includes first and second electrodes with a light-emitting layer interposed therebetween and an organic soluble derivative layer arranged between the first electrode and the light-emitting layer, wherein the organic soluble derivative layer prevents impurities from being diffused to the light-emitting layer.

19 Claims, 2 Drawing Sheets

ORGANIC EL DISPLAY DEVICE HAVING ORGANIC SOLUBLE DERIVATIVE LAYER

CROSS-REFERENCE TO RELATED APPLICATIONS

This application claims the benefit of Korean Patent Application No. 2001-74703 filed on Nov. 28, 2001, in the Korean Industrial Property Office, the disclosure of which is incorporated herein by reference.

BACKGROUND OF THE INVENTION

1. Field of the Invention

The present invention relates to an organic electroluminescent (EL) display device, and more particularly, to an organic EL display device having an organic soluble derivative layer.

2. Description of the Related Art

An organic EL display device includes an anode, a hole injection layer, a hole transporting layer, a light-emitting layer, an electron transporting layer, an electron injection layer, and a cathode which are sequentially stacked on a substrate. In the case of an organic EL display device comprising a low-molecular material, the above-described layers are formed using a vacuum deposition technique. In the case of an organic EL display device comprising a polymer, the above-described layers are formed using a spin-coating technique, which places limitations on forming the light-emitting layer thereof.

FIG. 1 shows a cross-sectional view of a conventional organic EL display device comprising a high-molecular material, such as a polymer. The organic EL display device includes an anode 10, a hole injection layer 12, a light-emitting layer 14, and a cathode 16 which are stacked in sequence as shown.

The hole injection layer 12 is formed using a spin coating technique, and has a structure such that the hole injection layer 12 is not dissolved in an organic solvent during a spin coating operation to form the light-emitting layer 14. As a result, an interface characteristic between the hole injection layer 12 and the light-emitting layer 14 deteriorates. In addition, water or inorganic and organic impurities affect the light-emitting layer 14, thereby lowering stability and shortening a life span of a resulting device.

U.S. Pat. No. 5,247,190 discloses an organic EL display device including an anode electrode and a cathode electrode with a light-emitting polymer interposed therebetween. The organic EL display device of U.S. Pat. No. 5,247,190 has a disadvantage in that a light-emitting efficiency is low and a life span is short because a work function of the two electrodes is not approximate or identical to a highest occupied molecular orbital (HOMO) value and a lowest unoccupied molecular orbital (LUMO) value of the light-emitting polymer.

In order to overcome the problem, the cathode electrode is made of a metal having a work function similar to the LUMO value of the light-emitting polymer. However, since the anode electrode has to be made of a transparent conductive material, there are many restrictions to using an anode electrode material.

Accordingly, a water-soluble material such as PEDOT (mixture of a poly(3,4)-ethylenedioxythiophene and a polystyrenesulfonate) or PANI (mixture of a polyaniline and a polystyrenesulfonate), available from Bayer AG and Allied Signal, respectively, is deposited on the anode electrode using a spin coating technique in order to form a hole injection layer. The hole injection layer buffers an interface between the anode electrode and the light-emitting polymer, thereby increasing a light-emitting efficiency, a driving voltage and a life span.

However, the PEDOT and the PANI are ionic materials which dissolve in water and are high in absorptiveness. Thus, even though a firing process is performed after the spin coating operation, it is almost impossible to remove the water remaining on a surface thereof. In particular, since the PEDOT and the PANI show a strong acidity when water exists therein, a reduction is likely to occur on an interface between the hole injection layer and the light-emitting polymer.

In addition, the PEDOT and the PANI provide poor adhesion to the light-emitting polymer. Therefore, where the light-emitting polymer is patterned to form a light-emitting layer, the light-emitting layer having a bad pattern characteristic is formed.

Currently, much research is being conducted to improve an interface characteristic between a hole injection layer and a light-emitting layer by introducing a surfactant or an adhesive.

On the other hand, U.S. Pat. No. 5,998,085 discloses a method of forming R, G and B light-emitting layers of an organic EL display device using a laser induced thermal imaging (LITI) technique. The LITI technique requires at least a light source, a transfer film and a substrate. Light emitted from the light source is absorbed by a light absorbing layer of the transfer film and is converted into a heat energy. An image forming material on the transfer film is transferred to the substrate by the heat energy to thereby form a desired image. The LITI technique is also used to form a color filter of a liquid crystal display (LCD) device and a light-emitting layer.

However, a conventional LITI technique shows a bad transfer characteristic. Therefore, there is a need for a material and a structure which improve a transfer characteristic of a light-emitting polymer of an organic EL display device.

SUMMARY OF THE INVENTION

Accordingly, it is an object of the present invention to provide an organic EL display device having a high light-emitting efficiency and an improved life span.

It is another object of the present invention to provide an organic EL display device having an excellent light-emitting layer pattern.

Additional objects and advantages of the invention will be set forth in part in the description which follows and, in part, will be obvious from the description, or may be learned by practice of the invention.

To achieve the above and other objects of the present invention, there is provided an organic EL display device comprising first and second electrodes with a light-emitting layer interposed therebetween, and an organic soluble derivative layer arranged between the first electrode and the light-emitting layer, wherein the organic soluble derivative layer prevents impurities from being diffused to the light-emitting layer.

There is also provided an organic EL display device comprising first and second electrodes with a light-emitting layer interposed therebetween, and at least one organic soluble derivative layer arranged between the first electrode and the light-emitting layer, wherein the organic soluble derivative layer increases an adhesion of the light-emitting layer.

The organic soluble derivative layer includes a synthetic polymer or a mixture which may also have a hole transporting ability, and has a solubility of more than 10 g/L to an organic solvent.

The synthetic polymer is one polymer selected from a group consisting of an arylamine-based polymer, a perylrene-based polymer, and a pyrrole-based polymer, and the mixture includes at least one optically inert polymer and at least one arylamine-based low-molecular material.

The optically inert polymer is one selected from a group consisting of a polystyrene, a poly(styrene-butadiene) copolymer, a polymethylmethacrylate, a polyalphamethylstyrene, a styrene-methylmethacrylate copolymer, a polybutadiene, a polycarbonate, a polyethyleneterephthalate, a polyestersulfonate, a polysulfonate, a polyarylate, a fluorinepolyimide, a transparent fluoric resin, and a transparent acrylic resin; and the arylamine-based low-molecular material is one selected from a group consisting of TPD (N,N'-diphenyl-N,N'-di-m-tolyl-biphenyl-4,4'-diamine), NPB, MTDATA (4,4',4"-tris (3-methylphenylphenylamino)triphenylamine), TDATA (4,4',4"-tris(N,N-diphenylamino)triphenylamine), and TDAPB (1,3,5-Tris[N,N-bis-(4-methoxyphenyl) aminophenyl]benzene) available from, for example, Sigma-Aldrich Corporation.

The mixture includes the arylamine-based low-molecular material of 10 wt % to 80 wt % dispersed in the optically inert polymer.

The organic soluble derivative layer has a thickness of 1 nm to 50 nm.

The light-emitting layer is patterned using a laser induced transfer/thermal imaging (LITI) technique.

BRIEF DESCRIPTION OF THE DRAWINGS

These and other objects and advantages of the present invention will become apparent and more readily appreciated from the following description of the embodiments, taken in conjunction with the accompanying drawings of which.

DETAILED DESCRIPTION OF THE PREFERRED EMBODIMENTS

Figure 1:
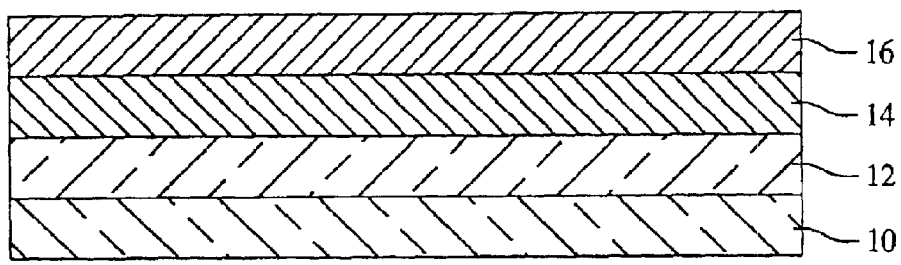
FIG. 1 is a cross-sectional view of a conventional organic EL display device comprising a polymer.

Reference will now be made in detail to the embodiments of the present invention, examples of which are illustrated in the accompanying drawings, wherein like reference numerals refer to the like elements throughout. The embodiments are described below in order to explain the present invention by referring to the figures.

Figure 2:
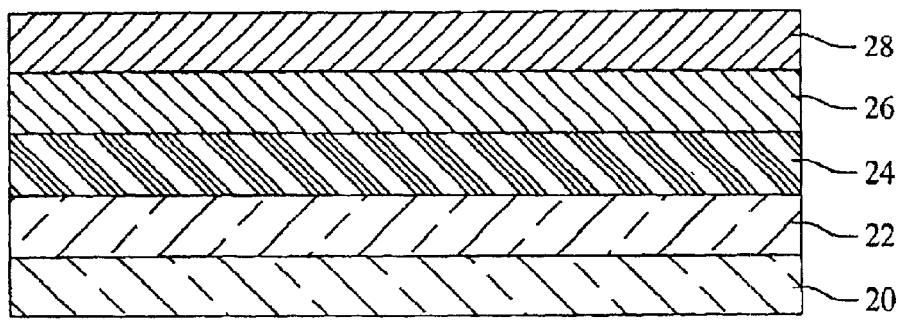
FIG. 2 is a cross-sectional view illustrating an organic EL display device according to an embodiment of the present invention.

FIG. 2 shows a cross-sectional view illustrating an organic EL display device according to an embodiment of the present invention. The organic EL display device includes an anode 20, a hole injection layer 22, an organic soluble derivative layer 24, a light-emitting layer 26, and a cathode electrode 28 which are stacked in sequence.

The organic soluble derivative layer 24 prevents impurities from being diffused from the hole injection layer 22 to the light-emitting layer 26 without lowering a hole transporting ability, thereby improving a performance characteristic of a resulting device. The organic soluble derivative layer 24 has an excellent adhesion to the light-emitting layer 26. Accordingly, when the light-emitting layer 26 is patterned by a LITI technique, the light-emitting layer 26 has an excellent pattern characteristic.

The organic soluble derivative layer 24 includes a synthetic polymer which may have a hole transporting ability or a mixture which may have a hole transporting ability, and has a relatively high solubility to an organic solvent, such as a benzene or a toluene. The organic soluble derivative layer has a solubility of, for example, more than 10 g/L. The synthetic polymer includes a PVK available from Sigma-Aldrich corporation, a BFE available from Dow chemical company, an arylamine-based polymer, a perylrene-based polymer, and a pyrrole-based polymer.

The mixture comprises an arylamine-based low-molecular material and an optically inert polymer.

The arylamine-based low-molecular material includes TPD, NPB, MTDATA, TDATA, and TDAPB available from, for example, Sigma-Aldrich Corporation.

The optically inert polymer includes a polystyrene, a poly(styrene-butadione) copolymer, a polymethylmethacrylate, a polyalphamethylstyrene, a styrene-methylmethacrylate copolymer, a polybutadiene, a polycarbonate, a polyethyleneterephthalate, a polyestersulfonate, a polysulfonate, a polyarylate, a fluorinepolyimide, a transparent fluoric resin, and a transparent acrylic resin.

The mixture may include the arylamine-based low-molecular material of 10 wt % to 80 wt % dispersed in the optically inert polymer.

As a clarification, it is understood that the organic soluble derivative layer 24 is not to be confused with a conventional hole transporting layer which may be formed between the hole injection layer and the light-emitting layers 12 and 14 of FIG. 1. That is, the organic soluble derivative layer 24 may be used in addition to a hole transporting layer in an organic EL display, or it may be formulated and used as a layer which increases adhesion of and prevents impurities from being diffused into the light-emitting layer 26, thereby improving a light-emitting efficiency and life span of the organic EL display, and in addition, serves to transport holes in the organic EL display.

Figure 3:
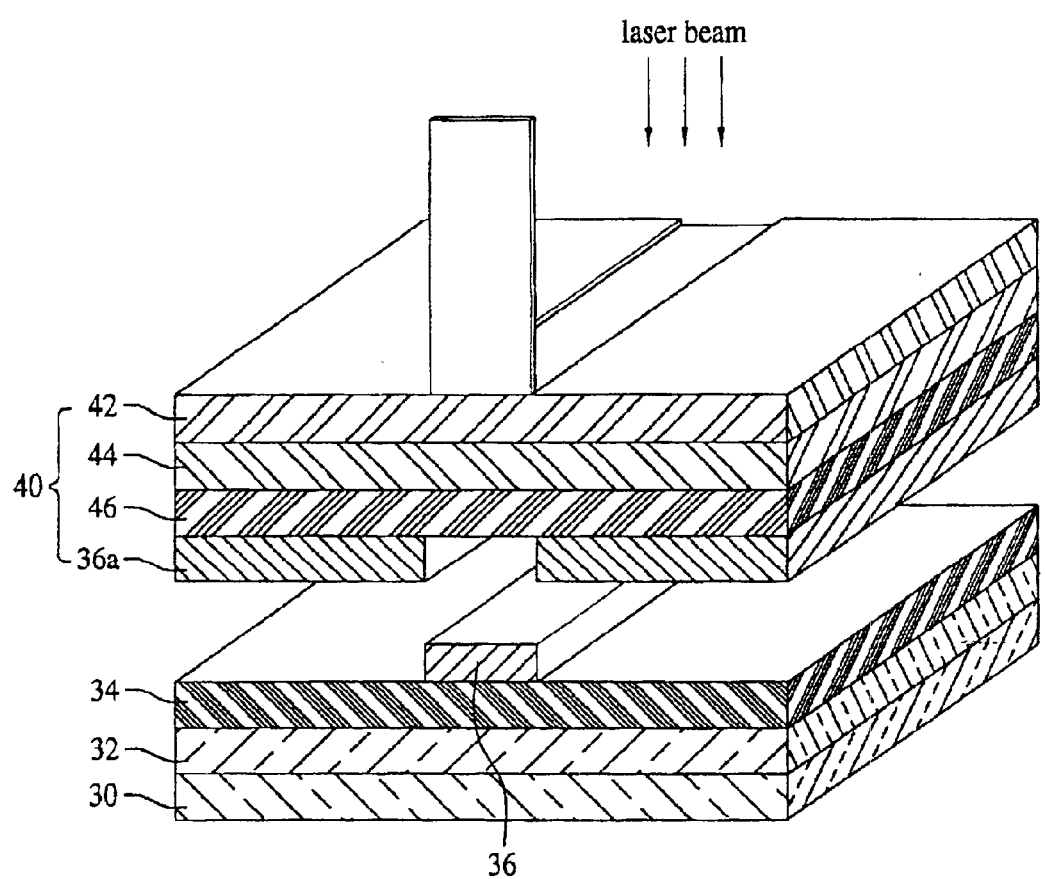
FIG. 3 is a partial perspective view illustrating a method of patterning a light-emitting layer using a LITI technique according to the present invention.

FIG. 3 shows a partial perspective view illustrating a method of patterning a light-emitting layer 36 using a LITI technique. A method of manufacturing an organic EL display device, with reference to FIG. 3, according to the present invention is described below.

A substrate 30 having an anode is cleaned in, for example, an acetone and an isopropylalcohol in sequence and is UV/ozone-treated. A hole injection layer 32 made of PEDOT or PANI is formed on the substrate 30 using, for example, a spin coating technique and then heat-treated at a temperature of 200° C. for five minutes. An organic soluble derivative is dissolved in an appropriate solvent in an appropriate concentration and stirred for, for example, at least one hour, and then filtered. The organic soluble derivative is deposited on the hole injection layer 32 using, for example, a spin-coating technique to a thickness of 1 nm to 50 nm to thereby form an organic soluble derivative layer 34.

In an organic EL display device, a light-emitting polymer may be dissolved in a solvent which does not dissolve the organic soluble derivative layer 34 and deposited using, for example, a spin coating technique to a thickness of tens of nanometer (nm) to form a light-emitting layer.

In the case of a full color organic EL display device, a transfer film 40 may be used and aligned with the substrate 30 having the hole injection layer 32 and the organic soluble derivative layer 34. The transfer film 40 includes a light-heat converting layer 44, and an interlayer insulating layer 46, and a light-emitting polymer layer 36a which are sequentially stacked on a transfer substrate 42. The light-emitting polymer layer 36a is transferred from the transfer film 40 onto the organic soluble derivative layer 34 using the LITI technique to thereby form the light-emitting layer 36. Thereafter, a cathode electrode (not shown) is formed on the light-emitting layer 36. Finally, an encapsulating operation is performed to complete the organic EL display device.

A method of manufacturing an organic EL display device having an organic soluble derivative layer of the present invention is described in detail below.

For example, a substrate having an anode is cleaned and then UV/ozone-treated for 15 minutes. A hole injection layer made of a "PEDOT/PSS," available from Bayer AG, is spin-coated on the substrate to a thickness of 20 nm to 50 nm at 3,000 rpm. An organic soluble derivative of 0.5 wt % available under the trade name "BFE" from Dow Chemical Company is dissolved in a toluene solvent and stirred for at least one hour, and spin-coated on the hole injection layer to a thickness of 10 nm to 50 nm at 3,000 rpm. Since the toluene does not dissolve the water-soluble hole injection layer, where the organic soluble derivative layer is coated, it does not damage the hole injection layer.

A light-emitting polymer of 1.0 wt % to 1.5 wt % available under the trade name "RED" or "BLUE" from Covion Organic Semiconductors GmbH is dissolved in a toluene solvent and sufficiently stirred, and thereafter a polystyrene having a molecular weight of 2,500 available from Sigma-Aldrich Corporation is mixed as a polymer additive to thereby prepare a mixed solution. A mixing mass ratio of the light-emitting polymer and the additive is RED:polystyrene=1:1, and BLUE:polystyrene=1:1.5. The mixed solution is sufficiently stirred at a temperature of 60° C. for at least three hours and is spin-coated on a transfer film to a thickness of 80 nm to thereby form a light-emitting polymer layer.

The light-emitting polymer layer of the transfer film is transferred onto the substrate using a LITI technique to thereby form a light-emitting layer.

Thereafter, a cathode electrode is formed on the light-emitting layer at a high vacuum atmosphere of less than $10^{-7}$ Torr. The cathode electrode includes a Ca layer of 50 nm and an Ag layer of 200 nm to 300 nm or a LiF layer of 0.4 nm to 4.0 nm and an Al layer of 100 nm to 600 nm. Finally, an encapsulating operation using a metal can is performed to complete the organic EL display device.

In the case of a red light-emitting layer, an edge roughness of the light-emitting layer patterned by the LITI process is less than 5 µm, leading to an excellent pattern characteristic. When the red light-emitting layer is used and the cathode electrode includes LiF/Al, a light-emitting efficiency is 1.25 Cd/A, a color coordinate is x=0.67 and y=0.32 (CIE 1931, 300 Cd/m² at 6.5 volts), and an expected life span is 2,000 hours at 100 Cd/m². On the other hands, when the red light-emitting layer is formed directly on the hole injection layer without employing the organic soluble derivative layer, a life span is 300 hours at 100 Cd/m².

In the case of a blue light-emitting layer, an edge roughness of the light-emitting layer patterned by the LITI is less than 10 µm, leading to an excellent pattern characteristic. When the blue light-emitting layer is used and the cathode electrode includes Ca/Ag, a light-emitting efficiency is 1.5 Cd/A, a color coordinate is x=0.15 and y=0.1 (CIE 1931, 200 Cd/m² at 6.5 volts), and an expected life span is 1,000 hours at 100 Cd/m². On the other hand, when the blue light-emitting layer is formed directly on the hole injection layer without employing the organic soluble derivative layer, a life span is 60 hours at 100 Cd/m².

As described above, the organic EL display device having the organic soluble derivative layer according to the present invention has a high light-emitting efficiency and an improved life span as compared to a conventional organic EL display device without the organic soluble derivative layer. In addition, the organic EL display device of the present invention has an excellent light-emitting layer pattern.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. An organic EL display device, comprising:
   a substrate;
   a first electrode formed on the substrate;
   a light-emitting layer on the first electrode;
   a second electrode formed on the light emitting layer; and
   an organic soluble derivative layer arranged between the first electrode and the light-emitting layer,
   wherein the organic soluble derivative layer prevents impurities from being diffused to the light-emitting layer.

2. The device of claim 1, wherein the organic soluble derivative layer includes a synthetic polymer or a mixture having a hole transporting ability, and has a solubility of more than 10 g/L to the organic solvent.

3. The device of claim 2, wherein:
   the synthetic polymer is one polymer selected from a group consisting of an arylamine-based polymer, a perylrene-based polymer, and a pyrrole-base polymer, and
   the mixture comprises at least one optically inert polymer and at least one arylamine-based low-molecular material.

4. The device of claim 3, wherein the optically inert polymer is one selected from a group consisting of a polystyrene, a poly(styrene-butadiene)copolymer, a polymethylmethacrylate, a polyalphamethylstyrene, a styrene-methylmethacrylate copolymer, a polybutadiene, a polycarbonate, a polyethyleneterephthalate, a polyestersulfonate, a polysulfonate, a polyarylate, a fluorinepolyimide, a transparent fluoric resin, and a transparent acrylic resin.

5. The device of claim 3, wherein the arylamine-based low molecular material is one selected from a group consisting of TPD, NPB, MTDATA, TDATA, and TDAPB.

6. The device of claim 3, wherein the mixture is the arylamine-based low-molecular material of 10 wt % to 80 wt % dispersed in the optically inert polymer.

7. The device of claim 1, wherein the organic soluble derivative layer has a thickness of 1 nm to 50 nm.

8. The device of claim 1, wherein the light-emitting layer is patterned using a laser transfer induced imaging (LITI) technique.

9. The device of claim 1, wherein the organic soluble derivative layer increases an adhesion of the light-emitting layer to the organic EL display device and improves a pattern characteristic of the light-emitting layer.

10. The device of claim 1, wherein the organic soluble derivative layer prevents impurities from being diffused to the light-emitting layer without lowering a hole transporting ability.

11. An organic EL display devise, comprising:

a substrate;

a first electrode formed on the substrate;

a light-emitting layer on the first electrode;

a second electrode formed on the light emitting layer; and at least one organic soluble derivative layer arranged between the first electrode and the light-emitting layer, wherein the organic soluble derivative layer increases an adhesion of the light-emitting layer to the organic EL display device and prevents impurities from being diffuse to the light-emitting layer.

12. The device of claim 11, wherein the organic soluble derivative layer includes a synthetic polymer or a mixture having a hole transporting ability, and has a solubility of more than 10 g/L in an organic solvent.

13. The device of claim 12, wherein:

the synthetic polymer is one polymer selected from a group consisting of an arylamine-based polymer, a perylrene-based polymer, and pyrrole-base polymer, and the mixture comprises at least one optically inert polymer and at least one arylamine-based low-molecular material.

14. The device of claim 13, wherein:

the optically inert polymer is one selected from a group consisting of a polystyrene, a poly(styrene-butadiene) copolymer, a polymethylmethacrylate, a polyalphamethylstyrene, a styrene-methylmethacrylate copolymer, a polybutadiene, a polycarbonate, a polyethyleneterephthalate, a polyestersulfonate, a polysulfonate, a polyarylate, a fluorinepolyimide, a transparent fluoric resin, and a transparent acrylic resin, and the arylamine-based low-molecular material is one selected from a group consisting of TPD, NPB, MTDATA, TDATA, and TDAPB.

15. The device of claim 14, wherein the mixture is the arylamine-based low-molecular material of 10 wt % to 80 wt % dispersed in the optically inert polymer.

16. The device of claim 14, wherein the organic soluble derivative layer has a thickness of 1 nm to 50 nm.

17. The device of claim 16, wherein the light-emitting layer is patterned using a laser transfer induced imaging (LITI) technique.

18. An organic EL display device, comprising:

first and second electrodes;

a light-emitting layer interposed between the first and second electrodes; and an organic soluble derivative layer arranged between the first electrode and the light-emitting layer, wherein the organic soluble derivative layer prevents impurities from being diffused to the light-emitting layer, wherein the organic soluble derivative layer includes a synthetic polymer or a mixture having a hole transporting ability, and has a solubility of more then 10 g/L to the organic solvent.

19. An organic EL display device, comprising:

first and second electrodes;

a light-emitting layer arranged between the first and second electrodes; and at least one organic soluble derivative layer arranged between the first electrode and the light-emitting layer, wherein the organic soluble derivative layer increases an adhesion of the light-emitting layer to the organic EL display device and prevents impurities from being diffused to the light-emitting layer, wherein the organic soluble derivative layer includes a synthetic polymer or a mixture having a hole transporting ability, and has a solubility of more than 10 g/L in an organic solvent.

* * * * *

UNITED STATES PATENT AND TRADEMARK OFFICE
CERTIFICATE OF CORRECTION

PATENT NO. : 6,853,147 B2
DATED : February 8, 2005
INVENTOR(S) : Min-Chul Suh et al.

It is certified that error appears in the above-identified patent and that said Letters Patent is hereby corrected as shown below:

Column 6,
Line 43, "base" should be -- based --.
Line 57, "low molecular" should be -- low-molecular --.

Column 7,
Line 9, "devise" should be -- device --.
Line 20, "diffuse" should be -- diffused --.
Line 28, "base" should be -- based --.

Signed and Sealed this

Twelfth Day of July, 2005

JON W. DUDAS
*Director of the United States Patent and Trademark Office*